US008025728B2

(12) United States Patent
Ichimura et al.

(10) Patent No.: US 8,025,728 B2
(45) Date of Patent: Sep. 27, 2011

(54) METHOD FOR MANUFACTURING SINGLE CRYSTAL OF NITRIDE

(75) Inventors: Mikiya Ichimura, Nagoya (JP); Katsuhiro Imai, Nagoya (JP); Chikashi Ihara, Nagoya (JP); Takatomo Sasaki, Suita (JP); Yusuke Mori, Suita (JP); Fumio Kawamura, Suita (JP)

(73) Assignees: NGK Insulators, Ltd., Nagoya (JP); Osaka University, Suita (JP)

( * ) Notice: Subject to any disclaimer, the term of this patent is extended or adjusted under 35 U.S.C. 154(b) by 0 days.

(21) Appl. No.: 12/284,470

(22) Filed: Sep. 22, 2008

(65) Prior Publication Data
US 2009/0095212 A1 Apr. 16, 2009

Related U.S. Application Data

(63) Continuation of application No. PCT/JP2007/053853, filed on Feb. 22, 2007.

(30) Foreign Application Priority Data

Mar. 24, 2006 (JP) ................................. 2006-084250

(51) Int. Cl.
C30B 29/38 (2006.01)

(52) U.S. Cl. ................. 117/82; 117/83; 117/84; 117/85; 117/86; 117/87

(58) Field of Classification Search ............... 117/82–87
See application file for complete search history.

(56) References Cited

U.S. PATENT DOCUMENTS

| 3,648,654 | A | * | 3/1972 | Bergh | 118/429 |
| 5,145,550 | A | * | 9/1992 | Tada et al. | 117/18 |
| 5,256,381 | A | * | 10/1993 | Tada et al. | 117/213 |
| 6,270,569 | B1 | | 8/2001 | Shibata et al. | |
| 6,780,239 | B2 | * | 8/2004 | Sarayama et al. | 117/36 |
| 7,261,775 | B2 | * | 8/2007 | Iwata et al. | 117/81 |
| 7,435,295 | B2 | * | 10/2008 | Kitaoka et al. | 117/64 |
| 2001/0055660 | A1 | * | 12/2001 | Tischler et al. | 428/64.1 |
| 2002/0028314 | A1 | * | 3/2002 | Tischler et al. | 428/64.1 |
| 2002/0046695 | A1 | * | 4/2002 | Sarayama et al. | 117/84 |
| 2003/0164138 | A1 | * | 9/2003 | Sarayama et al. | 117/84 |
| 2004/0183090 | A1 | * | 9/2004 | Kitaoka et al. | 257/103 |
| 2004/0226503 | A1 | * | 11/2004 | Iwata et al. | 117/2 |

(Continued)

FOREIGN PATENT DOCUMENTS

JP 11-60394 3/1999

(Continued)

OTHER PUBLICATIONS

Kawamura et al., "*Growth of Transparent, Large Size GaN Single Crystal with Low Disclocations Using Ca—Na Flux System*", Jpn. J. Appl. Phys., vol. 42, No. 7A, Jul. 1, 2003, pp. L729-L731.

(Continued)

*Primary Examiner* — Bob M Kunemund
(74) *Attorney, Agent, or Firm* — Burr & Brown

(57) ABSTRACT

A seed crystal is immersed in a melt containing a flux and a single crystal material in a growth vessel to produce a nitride single crystal on the seed crystal. A difference (TS-TB) of temperatures at a gas-liquid interface of the melt (TS) and at the lowermost part of the melt (TB) is set to 1° C. or larger and 8° C. or lower. Preferably, the substrate of seed crystal is vertically placed.

7 Claims, 10 Drawing Sheets

U.S. PATENT DOCUMENTS

| | | | |
|---|---|---|---|
| 2005/0011432 A1* | 1/2005 | Kitaoka et al. | 117/54 |
| 2005/0026318 A1* | 2/2005 | Sarayama et al. | 438/22 |
| 2005/0098090 A1* | 5/2005 | Hirota et al. | 117/2 |
| 2007/0034143 A1* | 2/2007 | Sarayama et al. | 117/89 |
| 2007/0175383 A1* | 8/2007 | Fukuda et al. | 117/35 |
| 2007/0215034 A1* | 9/2007 | Iwata et al. | 117/79 |
| 2007/0266928 A1* | 11/2007 | Iwata et al. | 117/3 |
| 2007/0296061 A1* | 12/2007 | Sasaki et al. | 257/615 |
| 2008/0282971 A1 | 11/2008 | Iwai et al. | |
| 2009/0078193 A1* | 3/2009 | Imai et al. | 117/71 |
| 2009/0095212 A1* | 4/2009 | Ichimura et al. | 117/68 |
| 2009/0120354 A1* | 5/2009 | Sarayama et al. | 117/203 |

FOREIGN PATENT DOCUMENTS

| | | |
|---|---|---|
| JP | 11268998 A * | 10/1999 |
| JP | 2003-313099 | 11/2003 |
| JP | 2004-231447 | 8/2004 |
| JP | 2005-154254 | 6/2005 |
| JP | 2005-175275 | 6/2005 |
| JP | 2005-187317 | 7/2005 |

OTHER PUBLICATIONS

U.S. Appl. No. 12/190,230, filed Aug. 2008, Iwai et al.
U.S. Appl. No. 12/192,428, filed Aug. 2008, Iwai et al.
U.S. Appl. No. 12/212,722, filed Sep. 2008, Iwai et al.
U.S. Appl. No. 12/234,786, filed Sep. 2008, Imai et al.
U.S. Appl. No. 12/234,799, filed Sep. 2008, Imai et al.
U.S. Appl. No. 12/556,015, filed Sep. 9, 2009, Ichimura at al.
Morishita et al., *The influences of supersaturation on LPE growth of GaN single crystals using the NA flux method*, Journal of Crystal Growth, 270 (2004), pp. 402-408.

* cited by examiner

METHOD FOR MANUFACTURING SINGLE CRYSTAL OF NITRIDE

FIELD OF THE INVENTION

The present invention relates to a method for producing a nitride single crystal.

BACKGROUND OF THE INVENTION

Gallium nitride-based III-V nitrides, which receive attention as excellent blue light-emitting devices, are in actual use as materials for light-emitting diodes and semiconductor laser diodes. In a method described in Japanese Patent Publication (Laid-Open) No. 2003-313099A, a group III nitride single crystal is grown using a flux method. That is, a seed crystal is placed in evenly heated flux such that the growth surface is parallel to a gas-liquid interface, thereby to grow a single crystal.

Further, in Japanese Journal of Applied Physics, Vol. 42 (2003), pp. L729-731 by Kawamura et al., a nitride single crystal is grown in a manner that a seed crystal is placed in evenly heated flux such that the growth surface is perpendicular to a gas-liquid interface. In this case, the seed crystal is placed vertically.

Still further, Japanese Patent Publication (Laid-Open) No. 2004-231447A discloses a method for growing a nitride single crystal by providing a considerably large difference in temperature between a gas-liquid interface and a single crystal-growing region. In an example of this document, a temperature difference within a melt is 150° C. or higher.

In addition, in Japanese Patent Publication (Laid-Open) No. 2005-154254A, a temperature difference within a melt is set to 10° C. to 300° C., preferably 100° C. to 200° C.

SUMMARY OF THE INVENTION

In the growth method described in Japanese Patent Publication (Laid-Open) No. 2003-313099A, however, impurity crystals tend to be generated since a nitrogen concentration is high at the gas-liquid interface. And further, there were many cases in which the growth of a single crystal is inhibited due to the accumulation of impurity crystals on a seed crystal placed horizontally. The impurity crystals adhere to the intended crystals firmly and thus are hardly removed therefrom.

According to the growth method described in "JJAP", Vol. 42 (2003), pp. L729-731 by Kawamura et al., it is possible to prevent the accumulation of impurity crystals generated at the gas-liquid interface on the growth surface of the seed crystal since the seed crystal is vertically placed. However, the crystal growth occurs on the growth surface near the gas-liquid interface preferentially, and hardly occurs near the lowermost part of the melt of the seed crystal. Therefore, only a single crystal with large in-plane thickness distribution can be formed.

In Japanese Patent Publication (Laid-Open) Nos. 2004-231447A and 2005-154254A, there is provided a description that the occurrence of impurity crystals can be suppressed by holding the gas-liquid interface at an elevated temperature at which no impurity crystal is generated and holding the seed crystal at a temperature at which the crystal growth occurs. However, according to follow-up experiments by the present inventors, a problem arose that impurity crystals are frequently generated in a liquid to be put on a seed crystal, although the occurrence of impurity crystals at the gas-liquid interface could be suppressed. Therefore, a problem that a defective is produced due to the adherence of impurity crystals to an intended single crystal is still not solved.

An object of the present invention is to suppress the adherence of impurity crystals to the single crystal and reduce the thickness distribution of the single crystal when a nitride single crystal is grown on a seed crystal using a flux method.

The present invention provides a method for producing a nitride single crystal on a seed crystal in a melt comprising a flux and a single crystal raw material within a growth vessel, wherein a difference (TS−TB) of temperatures at a gas-liquid interface of the melt (TS) and at the lowermost part of the melt (TB) is set to 1° C. or larger and 8° C. and smaller.

The present inventors minutely performed follow-up experiments concerning such various prior arts and then examined the results of the experiments. For example, as schematically shown in FIG. 1, a melt 10 is prepared in a growth vessel 7 by the application of heat and pressure, and a seed crystal 9 is horizontally immersed in the melt 10. Then, it is assumed that each portion of the melt 10 is uniform in temperature; that is, TB=TS.

A graph on the right side of FIG. 1 shows a relationship between a factor [N] (solid-liquid), a factor [N] (gas-liquid) and a factor [N]. The factor [N] (solid-liquid) is the maximum nitrogen solubility that is determined from solid-liquid equilibrium, and depends on the temperature at each portion of the melt. Therefore, in the example of FIG. 1, the factor [N] (solid-liquid) is nearly uniform within the whole melt. The factor [N] (gas-liquid) indicates the nitrogen solubility that is determined from gas-liquid equilibrium, and depends on the temperature at a gas-liquid interface and the nitrogen pressure. The factor [N] indicates the nitrogen concentration in the melt; when GaN is precipitated out of the melt, the nitrogen is consumed, and thus the nitrogen concentration in the melt is decreased. When the degree of supersaturation is adjusted so that GaN can be precipitated on a growth surface 9a of the seed crystal 9, supersaturation occurs near a gas-liquid interface 14 (an interface between a nitrogen-containing atmosphere 13 and the melt 10) as well, whereby impurity crystals 12 are generated. The impurity crystals 12 settle in the melt, and then adhere to a single crystal 8. FIG. 8 is a photograph of the growth vessel taken from above after the completion of such crystal growth, from which it can be seen that impurity crystals are generated along the gas-liquid interface.

On the other hand, as shown in FIG. 2, the present inventors also studied a method in which the seed crystal 9 is vertically placed in the melt. Then, it is assumed that the temperature in the melt is uniform. In this case, impurity crystals are generated near the gas-liquid interface, but the impurity crystals tend not to adhere to the single crystal 8. And further, since the nitrogen concentration is high at a portion of the seed crystal 9 near the gas-liquid interface 14, the single crystal 8 tends to be increased in thickness at the portion. However, since the nitrogen consumption is increased with distance from the gas-liquid interface in a downward direction, the nitrogen concentration [N] in the melt is decreased and the degree of supersaturation is thus decreased. As a result, the thickness of the single crystal is gradually decreased toward a bottom of the growth vessel 7.

Furthermore, as shown in FIG. 3, the present inventors also studied a method in which a temperature difference is provided in the melt within the growth vessel 7. That is, as indicated by the line A in the middle graph of FIG. 3, the temperature of the melt is set so as to be increased toward the gas-liquid interface 14. At that time, the temperature difference in the melt is set to, for example, 50° C. or higher in accordance with the teachings in the prior art references. In this case, however, since the factor [N] (solid-liquid) varies exponentially with the temperature T, the degree of supersaturation α=([N]/[N](solid-liquid)−1) becomes extremely high, and therefore, impurity crystals 15 tend to be generated in the melt. The impurity crystals generated in the melt settle and then adhere to the single crystal 8.

Then, as shown in FIG. 4, the present inventors studied a method in which a temperature difference is provided in the melt such that the temperature of the gas-liquid interface side of the melt is higher, and the seed crystal is placed vertically. In this case, even when the single crystal 8 is precipitated on the substrate 9 and the nitrogen concentration [N] in the melt is decreased, the factor [N] (solid-liquid) also becomes lower in the downward direction of the melt, and thus, the degree of supersaturation can be held substantially constant. Therefore, the single crystal 8 with substantially uniform in thickness and quality could be obtained. However, in order to obtain an effect that such uniformity in the film thickness is attained, the difference (TS−TB) between the temperature at the gas-liquid interface of the melt (TS) and the temperature at the lowermost part of the melt (TB) is need to be controlled to 10° C. or higher, preferably 30° C. or higher.

However, it has been found that when the temperature difference in the melt is set in accordance with the teachings in the prior art references, impurity crystals generated in the melt may actually adhere to the seed crystal placed vertically. That is, unlike the teachings in the prior art references, it has been revealed that even when the seed crystal is vertically placed, the adherence of the impurity crystals to the seed crystal cannot be prevented.

This mechanism was also studied. That is, as shown in FIG. 5, when the temperature difference in the melt is too large, the impurity crystals 15 generated in the melt tend to adhere to the upper portion of the seed crystal 8 as indicated by impurity crystals with reference numeral 16. Since the factor [N] (solid-liquid) is increased exponentially with increased temperature, the degree of supersaturation becomes extremely high at the upper portion of the melt with increased temperature difference in the melt. Accordingly, the impurity crystals 15 are generated in large quantity at the upper portion of the melt, and thus, tend to adhere to the single crystal 8.

Further, the present inventors conducted various studies. As a result, they have found that the difference (TS−TB) between the temperature at the gas-liquid interface of the melt (TS) and the temperature at the lowermost part of the melt (TB) is need to be controlled to 8° C. lower, preferably 7° C. lower. Such temperature difference is not described in the prior art references and contradict their contents. Then, it has been found that, by maintaining such a temperature gradient, the adherence of the impurity crystals to the seed crystal can be effectively prevented even if the seed crystal is placed vertically or horizontally, whereby the present invention has been accomplished.

DETAILED DESCRIPTION OF THE INVENTION

Figure 6:
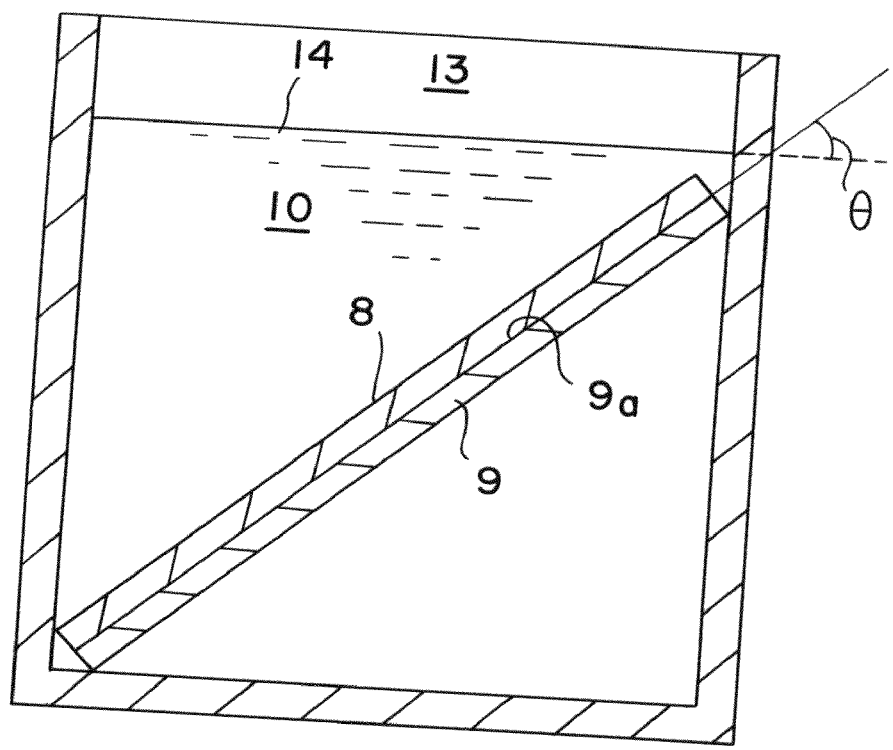
FIG. 6 is an illustration of a case where the seed crystal is diagonally placed within a growth vessel.

In a preferred embodiment of the present invention, as schematically illustrated in FIG. 6, an angle θ between the gas-liquid interface 14 of the melt 10 and the growth surface 9a of the seed crystal 9 is set to a range of from 45° to 135°, preferably from 80° to 100°; particularly preferably, the gas-liquid interface of the melt and the growth surface of the seed crystal are arranged substantially perpendicular to each other. As a result, it has been found that the impurity crystals further hardly adhere to the single crystal 8.

Further, in the case where the gas-liquid interface of the melt and the growth surface of the seed crystal are arranged substantially perpendicular to each other, plural seed crystals can be placed in and fixed to the growth vessel, whereby productivity is enhanced.

In the present invention, the angle θ may be less than 45°, and the gas-liquid interface of the melt and the growth surface of the seed crystal may be arranged substantially parallel to each other.

The temperature of each point of the melt is measured with a thermocouple, a radiation thermometer, calculated based on the thermal shrinkage amount of a ceramic molded body, or the like.

Figure 7:
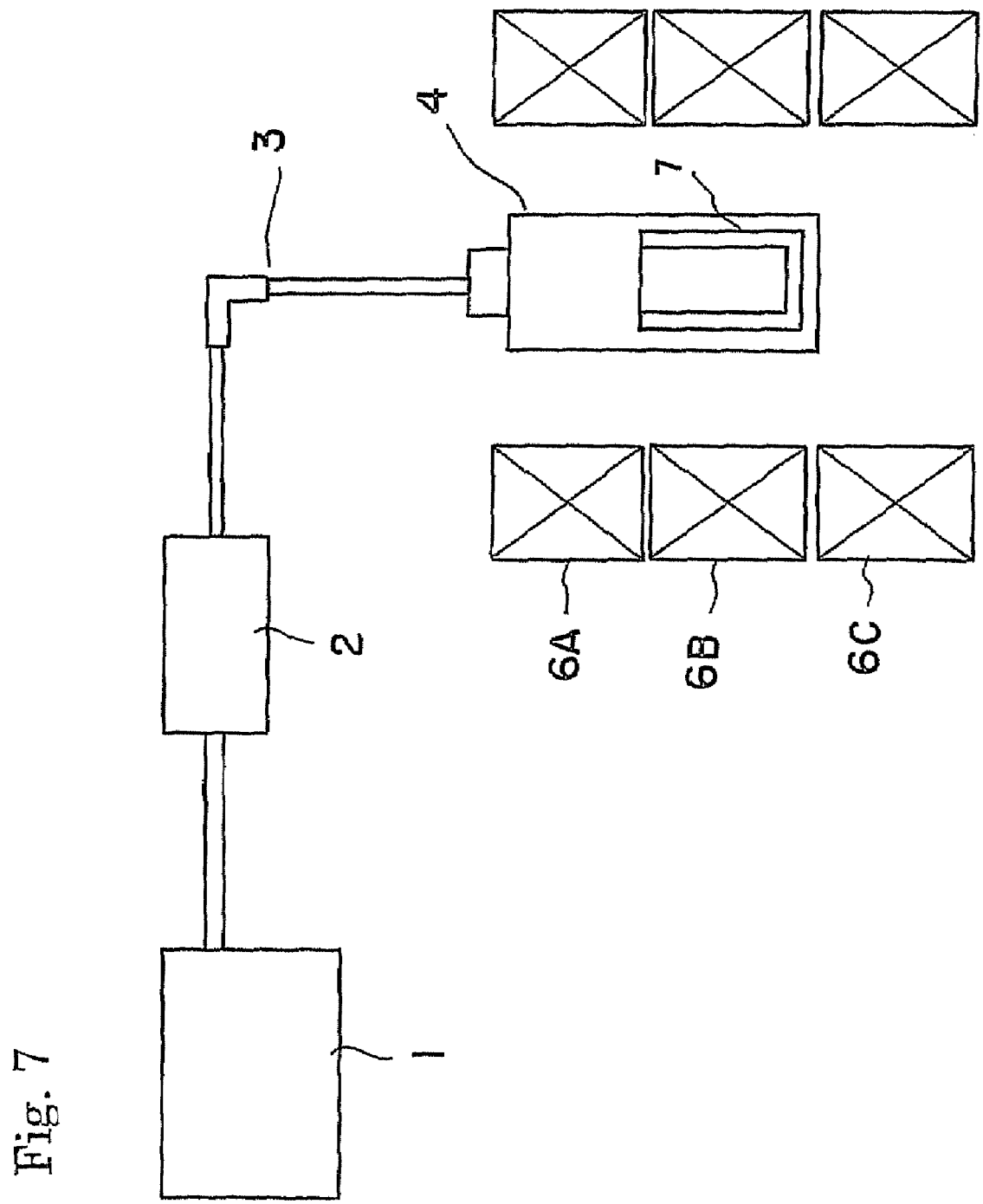
FIG. 7 is a schematic illustration of a growth apparatus that can be used in the present invention.
Figure 8:
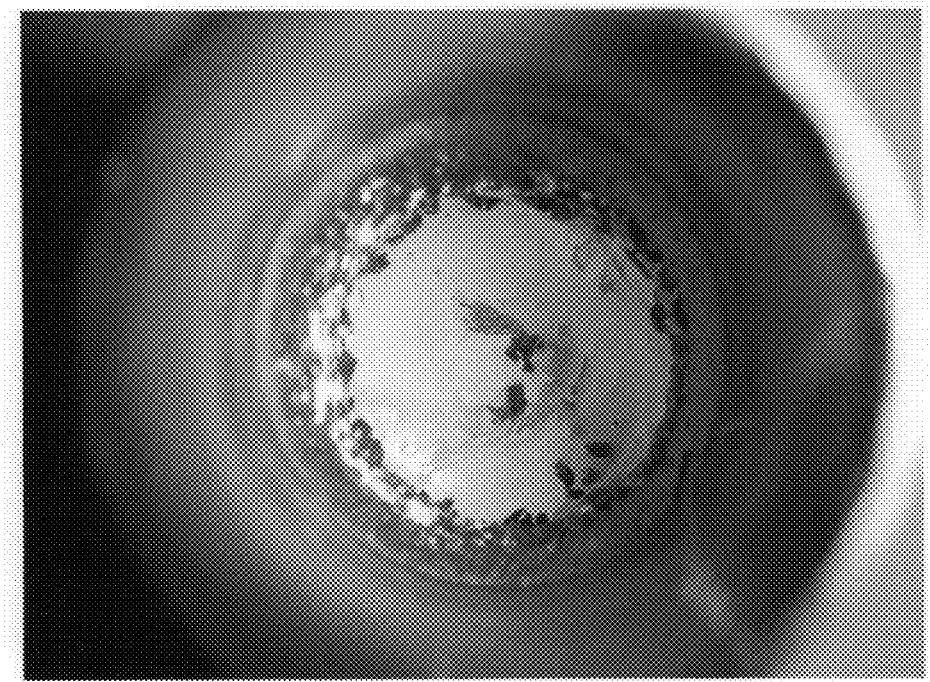
FIG. 8 is a photograph of the growth vessel in which impurity crystals are generated along a gas-liquid interface.

In a preferred embodiment, as schematically illustrated in FIG. 7, plural heating elements 6A, 6B and 6C are placed vertically to independently control each amount of heat thereof, that is, multi-zone control is performed vertically. Since the inside of a pressure vessel is subjected to a high temperature and a high pressure, controlling a temperature gradient in the vertical direction is generally difficult; however, by vertically placing the plural heating elements and zone-controlling each heating element, the temperature difference in the melt can be optimally controlled as in the embodiments of the present invention.

By making each heating element generate heat, supplying a nitrogen-containing atmosphere to a growth vessel 7 within an atmosphere controlling vessel 4 through a gas tank 1, a pressure control unit 2 and a pipe 3, and applying heat and pressure thereto, all mixed raw materials are melted in the growth vessel 7 to give the melt. When predetermined single crystal growth conditions are maintained at this stage, the nitrogen is stably supplied into the melt of the growth raw materials, whereby a single-crystal film is grown on the seed crystal.

A material of the heating elements used in the present invention is not particularly limited; but examples of such material include alloys such as iron-chromium-aluminum base alloys and nickel-chromium base alloys, high-melting point metals such as platinum, molybdenum, tantalum and tungsten, and nonmetals such as silicon carbide, molybdenum silicide and carbon.

In the single crystal growing apparatus according to the present invention, a unit for heating the raw material mixture to give the melt is not particularly limited. As such unit, a hot isostatic pressing unit is preferably used, and otherwise, an atmosphere-pressurized heating furnace may be used.

Although flux for producing the melt is not particularly limited, it is preferable to use one or more metals selected from the group consisting of alkali metals and alkaline earth metals or the alloys thereof. Examples of such metals include lithium, sodium, potassium, rubidium, cesium, beryllium, magnesium, calcium, strontium and barium; lithium, sodium and calcium are particularly preferred, and sodium is most preferred.

Examples of a metallic substance that is alloyed with one or more such metals selected from the group consisting of alkali metals and alkaline earth metals include gallium, aluminum, indium, boron, zinc, silicon, tin, antimony and bismuth.

According to the growth method of the present invention, such single crystals as GaN, AlN, InN, mixed crystal thereof (AlGaInN) and BN can be preferably grown.

The heating temperature and pressure set in a single crystal growing process are selected based on the kind of single crystal to be grown and thus are not particularly limited. The heating temperature can be set to 800 to 1500° C., for example, preferably 800 to 1200° C., more preferably 900 to 1100° C. The pressure is not particularly limited as well, but is preferably set to not lower than 1 MPa, more preferably not lower than 10 MPa. An upper limit of the pressure is not particularly specified, but can be set, for example, to not higher than 200 MPa, preferably not higher than 100 MPa.

A material of the growth vessel for performing such reaction is not particularly limited, and therefore, any material can be used provided that it is durable under the intended heating and pressurization conditions. Examples of such material include a high-melting metal such as metallic tantalum, tungsten or molybdenum, an oxide such as alumina, sapphire or yttria, a nitride ceramics such as aluminum nitride, titanium nitride, zirconium nitride or boron nitride, a carbide of high-melting point metal such as tungsten carbide or tantalum carbide, and a thermal decomposition product such as p-BN (pyrolytic BN) or p-Gr (pyrolytic graphite).

Examples of the single crystal and a procedure for growing the same will be shown below more specifically (Growth Example of Gallium Nitride Single Crystal)

A gallium nitride single crystal can be grown by utilizing the present invention and using flux containing at least sodium metal. In the flux, a gallium raw material is dissolved. As such gallium raw material, a gallium single metal, a gallium alloy or a gallium compound can be used; in terms of handling, a gallium single metal can be used preferably.

In the flux, a metal other than sodium, such as lithium, can be contained. Although the ratio between the gallium raw material and the flux raw material such as sodium may be set suitably, it is considered in general that an excessive quantity of sodium is used, which is not limited, of course.

In this embodiment, a gallium nitride single crystal is grown in an atmosphere of nitrogen-containing mixed gas under a total pressure of from 1 to 200 MPa. The setting of the total pressure to not lower than 1 MPa can grow a fine-quality gallium nitride single crystal at a high-temperature region of, for example, 800° C. or higher, more preferably 900° C. or higher. The reason for the above fact is not obvious; however, it is speculated that since the solubility of the nitrogen increases with increase in the temperature, the nitrogen dissolves in the growth melt efficiently. It is undesirable to set the total pressure in the atmosphere to not lower than 200 MPa, since the density of the high-pressure gas and the density of the growth melt become considerably close to each other and thus the growth melt is difficult to be retained in the vessel for reaction.

TABLE 1

Densities of various materials (g/cm$^3$)

| | Sodium metal | Nitrogen | Argon |
|---|---|---|---|
| 800° C. · 1 atm | 0.75 | 0.0003 | 0.0004 |
| 927° C. · 300 atm | | 0.08 | 0.11 |
| 927° C. · 1000 atm | | 0.21 | 0.33 |
| 927° C. · 2000 atm | | 0.3 (estimation) | 0.5 (estimation) |

In a preferred embodiment, during the growth, the nitrogen partial pressure in the atmosphere is set to 1 to 200 MPa. When the nitrogen partial pressure is set to not lower than 1 MPa, the dissolution of the nitrogen in the flux is promoted at a high-temperature region of, for example, 800° C. or higher, and a fine-quality gallium nitride single crystal can be grown. From this point of view, it is more preferable to set the nitrogen partial pressure in the atmosphere to not lower than 2 MPa. And further, from a practical point of view, it is preferable to set the nitrogen partial pressure to not higher than 100 MPa.

Although gas other than the nitrogen in the atmosphere is not limited, inert gas is preferred, and argon, helium or neon is particularly preferred. The partial pressure of the gas other than the nitrogen corresponds to a value obtained by subtracting the nitrogen partial pressure from the total pressure.

In a preferred embodiment, the growth temperature of the gallium nitride single crystal is set to 800° C. or higher, preferably 900° C. or higher, and more preferably 1000° C. or higher. In such high-temperature regions as well, fine-quality gallium nitride single crystals can be grown. Further, there is a possibility that productivity can be enhanced through the growth at high temperature and high pressure.

There is no upper limit of the growth temperature of the gallium nitride single crystal; however, since the crystal is difficult to be grown at excessively high growth temperature, the upper limit of the growth temperature is preferably set to 1500° C. or lower, and from this point of view, more preferably 1200° C. or lower.

A material of a substrate for epitaxially growing the gallium nitride crystal is not limited; examples of such material include sapphire, AlN template, GaN template, silicon single crystal, SiC single crystal, MgO single crystal, spinel ($MgAl_2O_4$), $LiAlO_2$, $LiGaO_2$, and perovskite composite oxides such as $LaAlO_3$, $LaGaO_3$, and $NdGaO_3$. It is possible to use cubic perovskite composite oxides represented by the composition formula $[A_{1-y}(Sr_{1-x}Ba_x)_y][(Al_{1-z}Ga_z)_{1-u}\cdot D_u]O_3$ (where A is a rare-earth element, D is one or more elements selected from the group consisting of niobium and tantalum, y=0.3 to 0.98, x=0 to 1, z=0 to 1, u=0.15 to 0.49, and x+z=0.1 to 2). In addition, SCAM ($ScAlMgO_4$) can be also used.

(Growth Example of AlN Single Crystal)

The present invention could be confirmed to be effective at growing an AlN single crystal by pressurizing a melt including a flux containing at least aluminium and alkaline earths in a nitrogen-containing atmosphere under specified conditions.

EXAMPLES

Example 1

Figure 4:
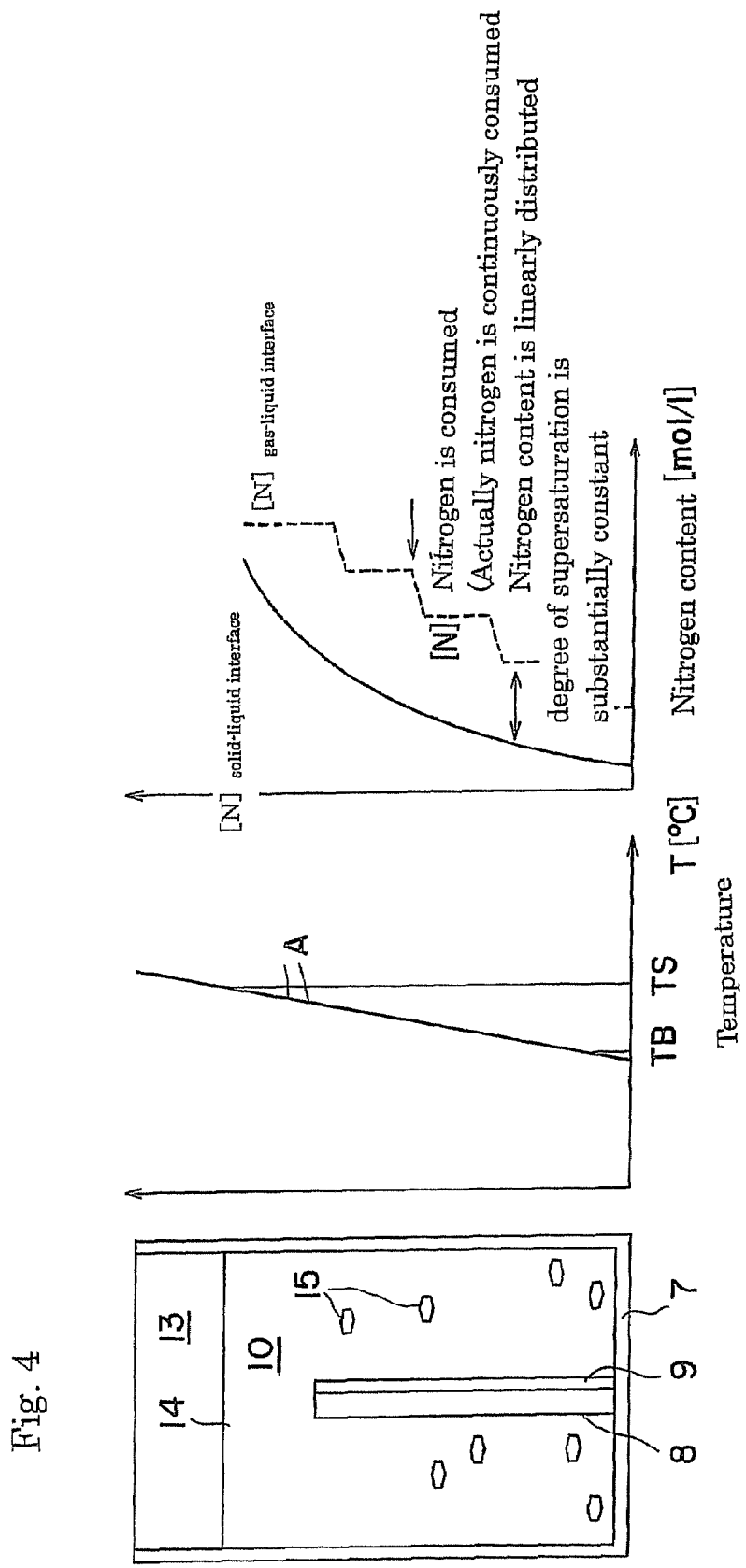
FIG. 4 is a schematic illustration of a case where the seed crystal is placed vertically and a temperature gradient is provided in the melt.

A GaN single crystal was grown using the growth method according to the present invention described with reference to FIGS. 4 and 7.

In particular, metallic gallium and metallic sodium as flux were each initially weighed out by 4 g, and then they were put in the growth vessel 7 along with a seed crystal. As the seed crystal 9, a group III nitride single crystal thin film which is epitaxially grown on a sapphire by means of a metalorganic chemical vapor deposition (MOCVD) method was used. The seed crystal was vertically placed such that the growth surface faces sideways. Then, the growth vessel was placed in the atmosphere controlling vessel 4 with a gas inlet, and then the vessel 4 was sealed. The series of operations were performed in an inert gas atmosphere to prevent oxidation of the raw materials, flux and so on.

After the sealed vessel was placed in an electric furnace provide with the three-zone heating elements 6A, 6B and 6C, the gas tank 1 was connected to the gas inlet via the pressure control unit 2. Since the temperatures of the three-zone heating elements can be controlled separately, a desired temperature gradient can be provided in the vertical direction of the growth vessel. Nitrogen gas was introduced such that the pressure was 4 MPa to the atmosphere controlling vessel in which the top and bottom of the growth vessel were heated and maintained at 860° C. and 855° C., respectively, and such conditions are maintained for 100 hours. The temperature difference (TS–TB) was 5° C. Thereafter, the growth vessel was taken out of the cooled atmosphere controlling vessel, and then the flux was removed through a reaction with ethanol to take out the GaN single crystal grown on the seed crystal.

The GaN single crystal grown on the seed crystal had the even thickness of about 0.2 mm. No impurity crystal adhered to the single crystal. Further, when the peak half-value widths of the X-ray diffraction were measured at three points of the single crystal, all of them were about 30 arcsec and no significant difference could be recognized between them, whereby it could be confirmed that the single crystal had uniform quality in the plane.

Example 2

A GaN single crystal was grown according to the growth method described with reference to FIGS. 4 and 7.

In particular, metallic gallium and metallic sodium as flux were each initially weighed out by 4 g, and then they were put in the growth vessel 7 along with a seed crystal. As the seed crystal, a group III nitride single crystal thin film which is epitaxially grown on a sapphire by means of MOCVD method was used. The seed crystal was vertically placed such that the growth surface faces sideways. Then, the growth vessel was placed in the atmosphere controlling vessel with the gas inlet, and then the vessel 4 was sealed. The series of operations were performed in an inert gas atmosphere to prevent oxidation of the raw materials, flux and so on.

After the sealed vessel was placed in the electric furnace provided with the three-zone heating elements, a nitrogen gas tank was connected to the gas inlet via the pressure control unit. Since the temperatures of the three-zone heating elements can be controlled separately a desired temperature gradient can be provided in the vertical direction of the growth vessel. Nitrogen gas was introduced such that the pressure was 60 MPa to the atmosphere controlling vessel in which the top and bottom of the growth vessel were heated and maintained at 1010° C. and 1005° C. respectively, and such conditions are maintained for 100 hours. The temperature difference (TS–TB) was 5° C. Thereafter, the growth vessel was taken out of the cooled atmosphere controlling vessel, and then the flux was removed through a reaction with ethanol to take out the GaN single crystal grown on the seed crystal.

The GaN single crystal grown on the seed crystal had the even thickness of about 0.5 mm. No impurity crystal adhered to the single crystal. Further, when the peak half-value widths of the X-ray diffraction were measured at three points of the single crystal, all of them were about 30 arcsec and no significant difference could be recognized between them, whereby it could be confirmed that the single crystal had uniform quality in the plane.

Figure 9:
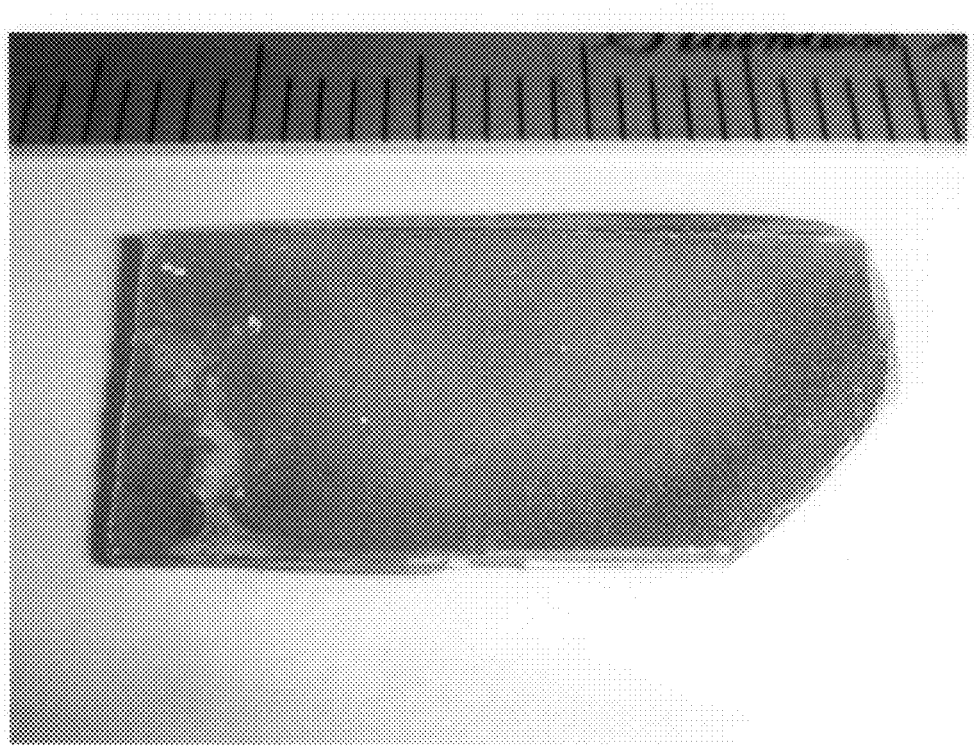
FIG. 9 is a photograph showing an external appearance of a GaN single crystal obtained in Example 2.

FIG. 9 is a photograph of the GaN single crystal grown on the seed crystal in uniform thickness.

Example 3

A GaN single crystal was grown according to the growth method described with reference to FIGS. 4, 6 and 7.

In particular, metallic gallium and metallic sodium as flux were each initially weighed out by 3 g, and then they were put in the growth vessel along with a seed crystal. As the seed crystal, a group III nitride single crystal thin film which is epitaxially grown on a sapphire by means of MOCVD method was used. The seed crystal was diagonally placed such that an angle between the growth surface and the gas-liquid interface was 45°. Then, the growth vessel was placed in the atmosphere controlling vessel with the gas inlet, and then the atmosphere controlling vessel was sealed. The series of operations were performed in an inert gas atmosphere to prevent oxidation of the raw materials, flux and so on.

After the sealed vessel was placed in the electric furnace provided with the three-zone heating elements, a nitrogen gas tank was connected to the gas inlet via the pressure control unit. Since the temperatures of the three-zone heating elements can be controlled separately, a desired temperature gradient can be provided in the vertical direction of the growth vessel. Nitrogen gas was introduced such that the pressure was 4 MPa to the atmosphere controlling vessel in which the top and bottom of the growth vessel were heated and maintained at 860° C. and 855° C. respectively, and such conditions are maintained for 100 hours. The temperature difference (TS–TB) was 5° C. Thereafter, the growth vessel was taken out of the cooled atmosphere controlling vessel, and then the flux was removed through a reaction with ethanol to take out the GaN single crystal grown on the seed crystal.

The GaN single crystal grown on the seed crystal had the even thickness of about 0.3 mm. No impurity crystal adhered to the single crystal. Further, when the peak half-value widths of the X-ray diffraction were measured at three points of the single crystal, all of them were about 30 arcsec and no significant difference could be recognized between them, whereby it could be confirmed that the single crystal had uniform quality in the plane.

Example 4

Figure 1:
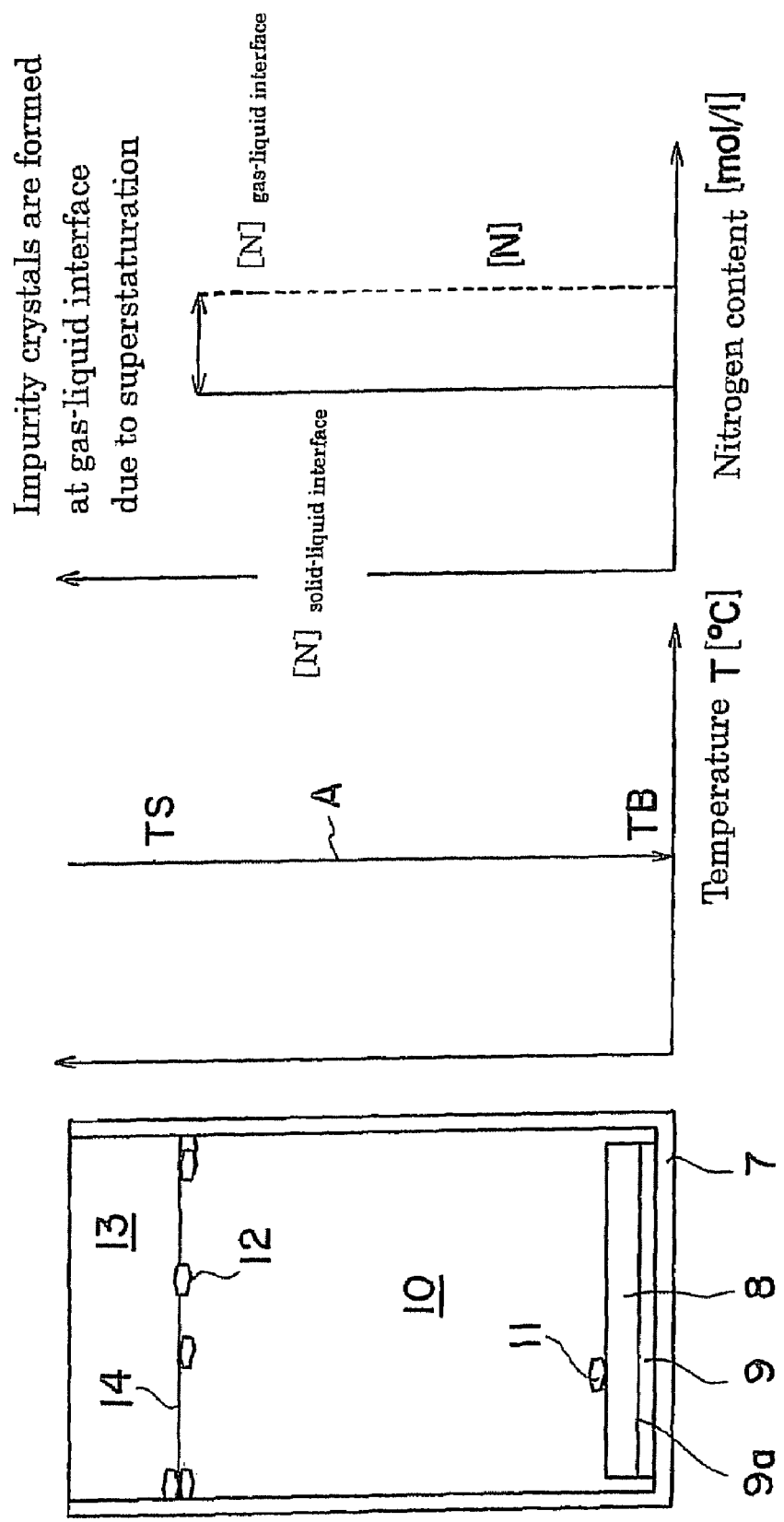
FIG. 1 is a schematic illustration of a case where a seed crystal is placed horizontally and no temperature gradient is provided in a melt 10.
Figure 2:
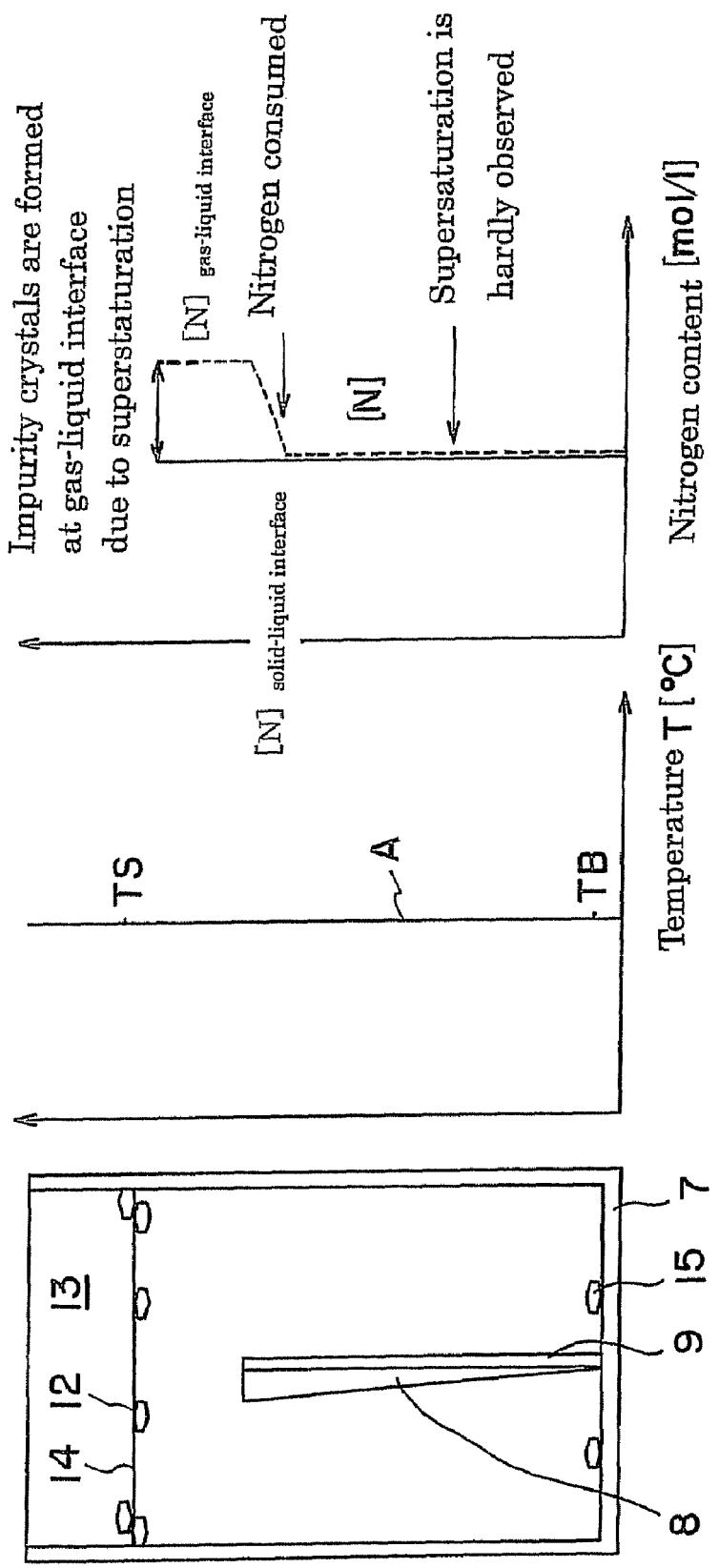
FIG. 2 is a schematic illustration of a case where the seed crystal is placed vertically and no temperature gradient is provided in the melt.
Figure 3:
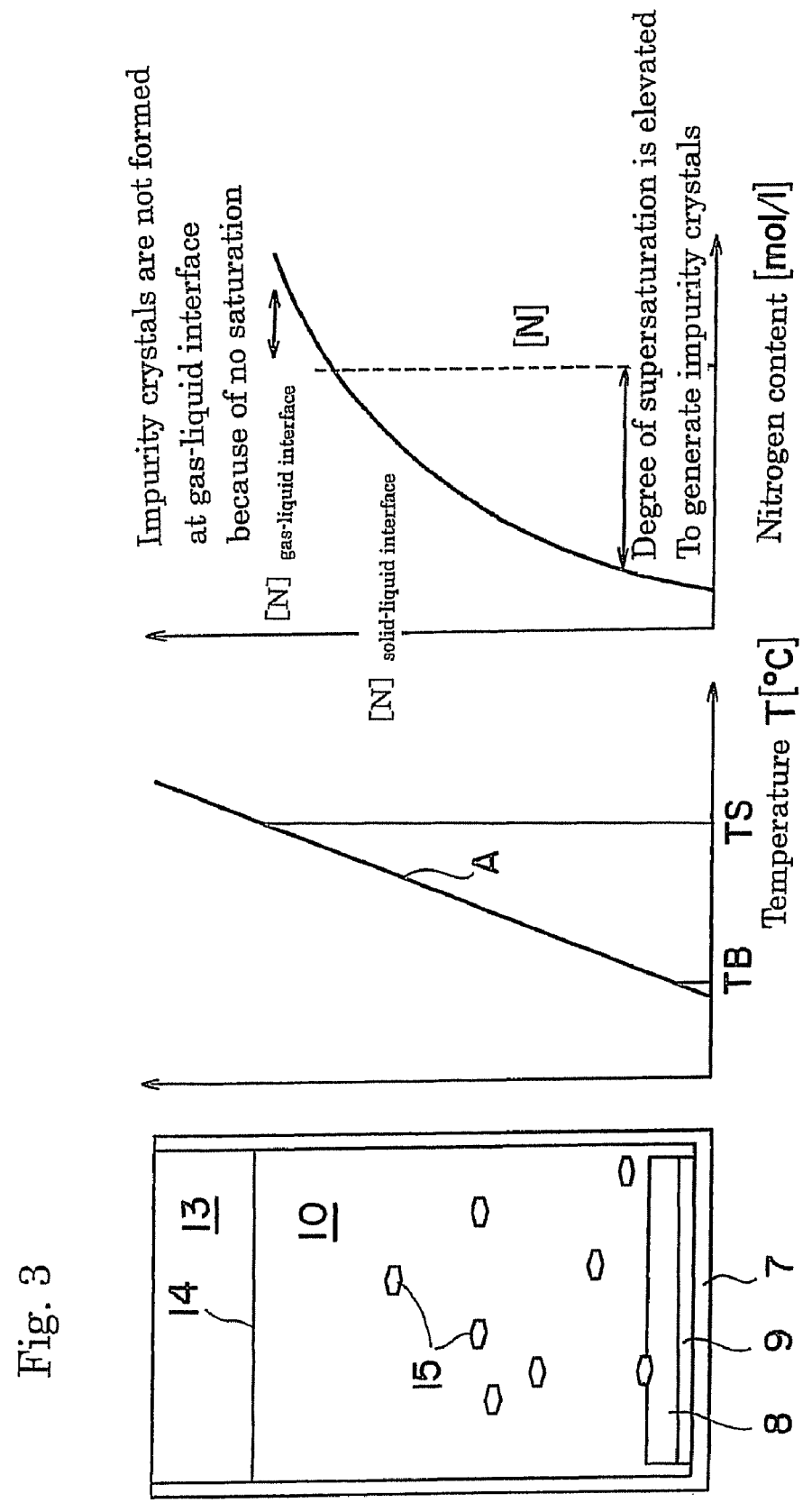
FIG. 3 is a schematic illustration of a case where the seed crystal is placed horizontally and a temperature gradient is provided in the melt.

A GaN single crystal was grown according to the growth method described with reference to FIGS. 3 and 7.

In particular, metallic gallium and metallic sodium as flux were each initially weighed out by 1 g, and then they were put in the growth vessel along with a seed crystal. As the seed crystal, a group III nitride single crystal thin film which is epitaxially grown on a sapphire by means of MOCVD method was used. The seed crystal was placed in the bottom of the growth vessel such that the growth surface faces upward. Then, the growth vessel was placed in the atmosphere controlling vessel with the gas inlet, and then the atmosphere controlling vessel was sealed. The series of operations were performed in an inert gas atmosphere to prevent oxidation of the raw materials, flux and so on.

After the sealed vessel was placed in the electric furnace provided with the three-zone heating elements, a nitrogen gas tank was connected to the gas inlet via the pressure control unit. Since the temperatures of the three-zone heating elements can be controlled separately, a desired temperature gradient can be provided in the vertical direction of the growth vessel. Nitrogen gas was introduced such that the pressure was 4 MPa to the atmosphere controlling vessel in which the top and bottom of the growth vessel were heated and maintained at 860° C. and 855° C. respectively, and such conditions are maintained for 100 hours. The temperature difference (TS−TB) was 5° C. Thereafter, the growth vessel was taken out of the cooled atmosphere controlling vessel, and then the flux was removed through a reaction with ethanol to take out the GaN single crystal grown on the seed crystal.

Figure 10:
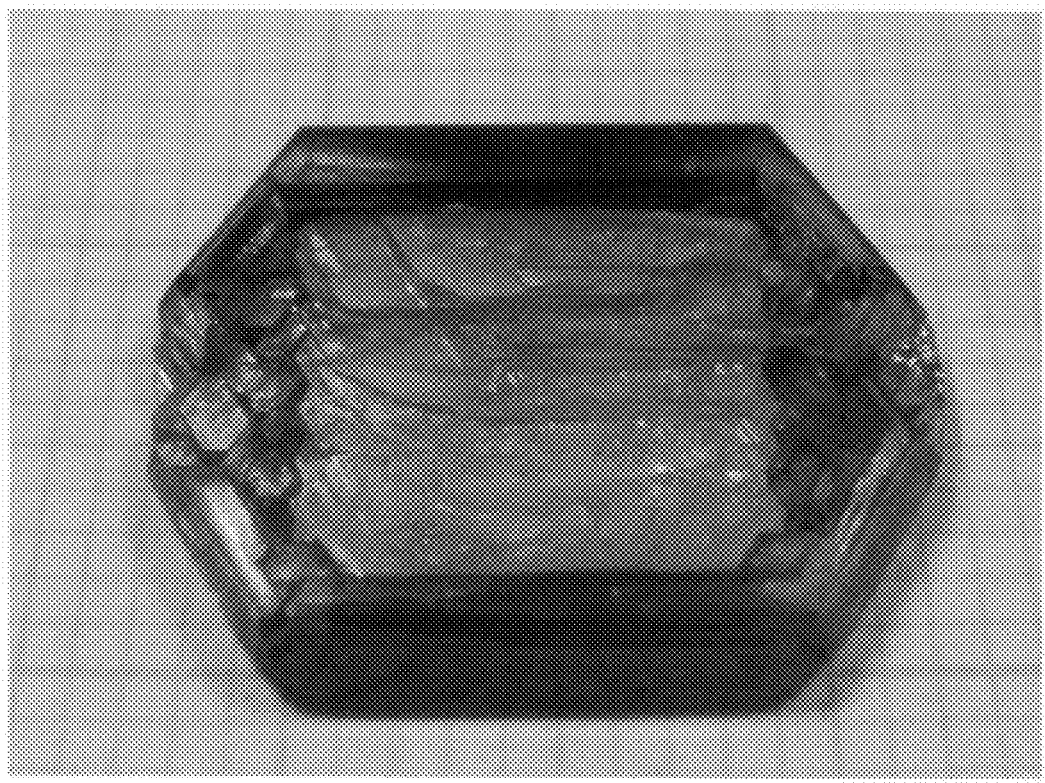
FIG. 10 is a photograph showing an external appearance of a GaN single crystal obtained in Example 4.

The GaN single crystal grown on the seed crystal had the thickness of about 1.5 mm. No impurity crystal adhered to the single crystal. Further, the measured peak half-value widths of the X-ray diffraction were 65 arcsec, whereby it could be confirmed that the single crystal was of high quality. FIG. 10 is a photograph showing an external appearance of the obtained GaN single crystal, from which it can be seen that the crystal is of high quality and no impurity crystal adheres thereto.

Comparative Example 1

Figure 5:
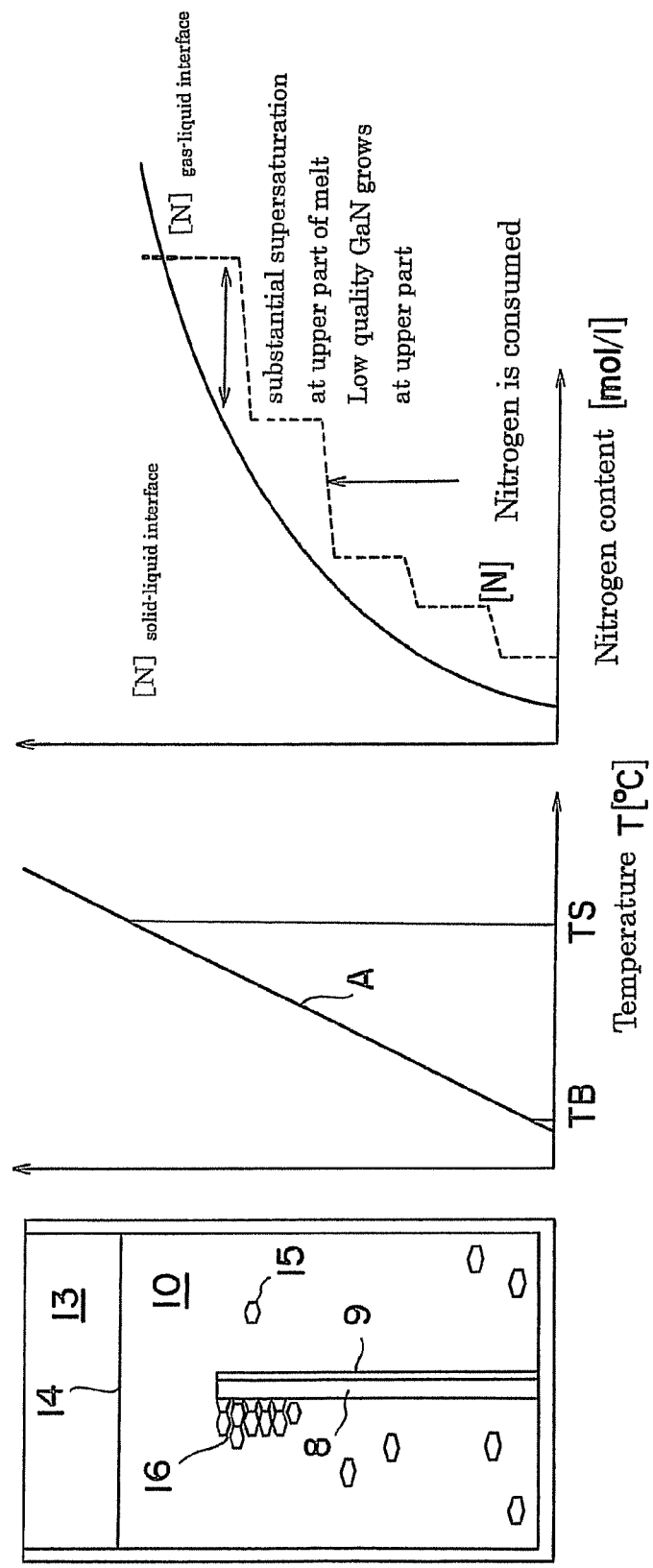
FIG. 5 is a schematic illustration of a case where the seed crystal is placed vertically and a large temperature difference is provided in the melt.

A GaN single crystal was grown according to the growth method described with reference to FIG. 5.

In particular, metallic gallium and metallic sodium as flux were each initially weighed out by 4 g, and then they were put in the growth vessel along with a seed crystal. As the seed crystal, a group III nitride single crystal thin film which is epitaxially grown on a sapphire plate by means of MOCVD method was used. The seed crystal was vertically placed such that the growth surface faces sideways. Then, the growth vessel placed in the atmosphere controlling vessel with the gas inlet, and then the atmosphere controlling vessel was sealed. The series of operations were performed in an inert gas atmosphere to prevent oxidation of the raw materials, flux and so on.

After the sealed vessel was placed in the electric furnace provided with the three-zone heating elements, a nitrogen gas tank was connected to the gas inlet via the pressure control unit. Since the temperatures of the three-zone heating elements can be controlled separately, a desired temperature gradient can be provided in the vertical direction of the growth vessel. Nitrogen gas was introduced such that the pressure was 60 MPa to the atmosphere controlling vessel in which the top and bottom of the growth vessel were heated and maintained at 1010° C. and 970° C. respectively, and such conditions are maintained for 100 hours. The temperature difference (TS−TB) was 40° C. Thereafter, the growth vessel was taken out of the cooled atmosphere controlling vessel, and then the flux was removed through a reaction with ethanol to take out the GaN single crystal grown on the seed crystal.

The thickness of the GaN single crystal grown on the seed crystal was as largely uneven as about 1 mm at the upper portion and about 10 μm at the lower portion. Further, the grown crystal was an aggregate of oriented microcrystals, and the peak half-value widths of the X-ray diffraction were as remarkably large as 500 arcsec.

Comparative Example 2

A GaN single crystal was grown according to the same method as in Comparative Example 1, except that the temperature difference (TS−TB) was set to 10° C.

The GaN single crystal grown on the seed crystal had a thickness of about 1 mm at the upper portion and about 50 μm at the lower portion. Further, the grown crystal was an aggregate of oriented microcrystals, and the peak half-value widths of the X-ray diffraction were as remarkably large as 400 arcsec at the upper portion and 200 arcsec at the lower portion, and therefore, were uneven.

The present invention has been described hereinabove with reference to the specific embodiments; however, the invention is not limited to these embodiments, and can be practiced while making various modifications and alterations without departing from the scope of the appended claims.

The invention claimed is:

1. A method for producing a nitride single crystal on a seed crystal in a melt comprising a flux and a material of the single crystal in a growth vessel,
   wherein the melt directly contacts an atmosphere comprising at least nitrogen at a gas-liquid interface and the nitrogen for growth of the nitride single crystal is supplied from the atmosphere into the melt through the gas-liquid interface,
   wherein a difference (TS-TB) of a temperature (TS) at the gas-liquid interface of the melt and a temperature (TB) at the lowermost part of the melt is set to 1° C. or larger and 8° C. or smaller, and
   wherein the temperature (TS) at the gas-liquid interface of the melt is higher than the temperature (TB) at the lowermost part of the melt.

2. The method for producing a nitride single crystal of claim 1, wherein the difference (TS-TB) of the temperature (TS) at the gas-liquid interface of the melt and the temperature (TB) at the lowermost part of the melt is set to 3° C. or larger and 7° C. or smaller.

3. The method for producing a nitride single crystal of claim 1, wherein the gas-liquid interface of the melt and a growth surface of the seed crystal are intersected at an angle in a range of from 45° to 135°.

4. The method for producing a nitride single crystal of claim 3, wherein the gas-liquid interface of the melt and the growth surface of the seed crystal are substantially perpendicular to each other.

5. The method for producing a nitride single crystal of claim 1, wherein the gas-liquid interface of the melt and a growth surface of the seed crystal are substantially parallel to each other.

6. The method for producing a nitride single crystal of claim 2, wherein the gas-liquid interface of the melt and a growth surface of the seed crystal are intersected at an angle in a range of from 45° to 135°.

7. The method for producing a nitride single crystal of claim 2, wherein the gas-liquid interface of the melt and a growth surface of the seed crystal are substantially parallel to each other.

* * * * *